US009404727B2

(12) United States Patent
Baldwin et al.

(10) Patent No.: US 9,404,727 B2
(45) Date of Patent: Aug. 2, 2016

(54) INDUCTIVE POSITION SENSING WITH SINGLE CHANNEL INTERFACE TO MULTIPLE RESONANT SENSORS

(71) Applicant: TEXAS INSTRUMENTS INCORPORATED, Dallas, TX (US)

(72) Inventors: Jonathan V. Baldwin, Sunnyvale, CA (US); Murali Srinivasa, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 96 days.

(21) Appl. No.: 14/486,575

(22) Filed: Sep. 15, 2014

(65) Prior Publication Data

US 2015/0077094 A1 Mar. 19, 2015

Related U.S. Application Data

(60) Provisional application No. 61/878,443, filed on Sep. 16, 2013.

(51) Int. Cl.
| | |
|---|---|
| *G01B 7/14* | (2006.01) |
| *G01B 7/30* | (2006.01) |
| *G01B 7/00* | (2006.01) |
| *H03H 5/02* | (2006.01) |
| *H03M 1/12* | (2006.01) |
| *H03K 17/95* | (2006.01) |
| *H03K 17/972* | (2006.01) |
| *G01D 5/20* | (2006.01) |
| *H03K 17/97* | (2006.01) |

(52) U.S. Cl.
CPC *G01B 7/003* (2013.01); *G01D 5/20* (2013.01); *H03H 5/02* (2013.01); *H03K 17/9542* (2013.01); *H03K 17/972* (2013.01); *H03M 1/12* (2013.01); *H03K 2017/9706* (2013.01)

(58) Field of Classification Search
CPC ........... G01B 7/003; H03H 5/02; H03M 1/12; G01D 5/20; H03K 17/9542; H03K 17/972; H03K 2017/9706
USPC ........................................ 324/207.17, 207.26
See application file for complete search history.

(56) References Cited

U.S. PATENT DOCUMENTS

| | | |
|---|---|---|
| 5,986,549 A | 11/1999 | Teodorescu |
| 2003/0071638 A1 | 4/2003 | Machul |
| 2009/0140728 A1 | 6/2009 | Rollins et al. |

FOREIGN PATENT DOCUMENTS

RU 2421741 C1 6/2011

OTHER PUBLICATIONS

PCT Search Report PCT/US14/55948 mailed Jan. 29, 2015.

(Continued)

*Primary Examiner* — Jay Patidar
(74) *Attorney, Agent, or Firm* — Andrew Viger; Frank D. Cimino (57) ABSTRACT

An inductive sensing system includes multiple resonant sensors interfaced to an inductance-to-digital conversion (IDC) unit through a single channel interface. IDC establishes an IDC control loop that incorporates resonant sensors as loop filters. The IDC control loop drives resonant sensors to a system resonance state in which each resonant sensor is driven to a resonant frequency state. Each resonant sensor is configured for a nominal resonant frequency state that differentiates it from the other resonant sensors. IDC senses changes in system resonance state representative of target-sensing conditions, and responds by driving a target-sensing system resonance state. IDC converts IDC loop (resonance) control signals resulting from a target-sensing condition into sensor data as representing the corresponding target-sensing resonant frequency state as an indication of target position (proximity or range) relative to a target-sensing resonant sensor. The sensor data can be provided to a data processor for proximity/range processing.

20 Claims, 3 Drawing Sheets

(56) References Cited

OTHER PUBLICATIONS

RU2421741C1, English Machine Translation.
"Resonant Inductive Position Sensors. How They Work," [online] 2010 [retrieved on Dec. 22, 2014]. Retrieved from the Internet: URL: http://www.sensorland.com/HowPage101.html (when received, words were hole punched and not readable).
"Resonant Inductive Position Sensors. How They Work," [online] 2010 [retrieved on Sep. 15, 2015]. Retrieved from the Internet: URL: http://www.sensorland.com/HowPage101.html (pulled version with no hole punch, but different date).

INDUCTIVE POSITION SENSING WITH SINGLE CHANNEL INTERFACE TO MULTIPLE RESONANT SENSORS

CROSS-REFERENCE TO RELATED APPLICATIONS

Priority is claimed under USC §119(e) to U.S. Provisional Application 61/878,443, filed 16 Sep. 2013.

BACKGROUND

1. Technical Field

This Patent Disclosure relates generally to inductive sensing, such as may be used in measuring or detecting position, proximity or physical state or condition.

2. Related Art

Inductive resonant sensing is based on a resonant sensor that includes a resonator. The resonator is driven to operate at steady-state oscillation, projecting magnetic flux energy for sensing a conductive target. Applications include proximity or position sensing relative to the conductive target.

A resonant sensor includes a resonator, such as an LC tank circuit, characterized by a resonator frequency and resonator oscillation amplitude (resonance state). The resonator is configured for a nominal resonant frequency state (no target present), characterized by steady-state oscillation at a resonant frequency and resonant amplitude. For the nominal resonant frequency state, the resonator is driven with sufficient excitation to overcome inherent circuit losses such as coil resistance and lossy dielectric, which can be characterized as a resonant impedance (impedance at resonance).

For inductive sensing, magnetic flux energy projected from the inductive sensing coil induces eddy currents in a conductive target within a sensing range/area of the resonant sensor. Eddy current losses effectively change resonator impedance, resulting in changes in resonance state, as manifested by, for example, changes in resonator oscillation amplitude and frequency. This change in resonance state translates to a change in resonant frequency state relative to the nominal resonant frequency state, corresponding to a change in resonant impedance).

BRIEF SUMMARY

This Brief Summary is provided as a general introduction to the Disclosure provided by the Detailed Description and Figures, summarizing some aspects and features of the disclosed invention. It is not a complete overview of the Disclosure, and should not be interpreted as identifying key elements or features of the invention, or otherwise characterizing or delimiting the scope of the invention disclosed in this Patent Document.

The Disclosure describes apparatus and methods adaptable for inductive position sensing system with multiple resonant sensors, each adapted to sense target position as a position of a respective conductive target within a sensing range relative to the resonant sensor. The multiple resonant sensors are interfaced to an inductance-to-digital conversion (IDC) unit through an IDC single-channel interface, the multiple resonant sensors and the IDC unit configured in a series-loop topology.

Each resonant sensor includes a resonator configured for a resonant frequency state (steady-state oscillation amplitude and resonator frequency), and a sensing range, and configured for operation at: (a) a nominal resonant frequency state in which the target for the resonant sensor is outside its sensing range, the resonator configured so that the nominal resonant frequency state is unique relative to a nominal resonant frequency state of any other resonant sensor; and (b) a target-sensing resonant frequency state that corresponds to a target-sensing resonant sensor in a target-sensing condition in which its respective target is at a target position within its sensing range, the resonator configured so that the target-sensing resonant frequency state does not overlap with any target-sensing resonant frequency state of any other resonant sensor in a respective target-sensing condition.

The IDC unit is configured to drive a system resonance state in which each resonant sensor is driven to a resonant frequency state, including a nominal system resonance state in which each resonant sensor is driven to its nominal resonant frequency state, and including a target-sensing system resonance state in which at least one resonant sensor is driven to a target-sensing resonant frequency state associated with a target-sensing condition.

The IDC unit establishes an IDC control loop including resonance control circuitry and IDC loop control circuitry, and including as a loop filter each respective resonator of the series-loop coupled resonant sensors. The resonance control circuitry is configured to control system resonance state in response to a resonance control signal, including a target-sensing system resonance state in response to a target-sensing condition at a target-sensing resonant sensor. The IDC loop control circuitry is configured to generate the resonance control signal, including a target-sensing resonance control signal corresponding to the target-sensing system resonance state for the target-sensing condition. The resonance control circuitry is responsive to the target-sensing resonance control signal to drive system resonance state to the target-sensing system resonance state, with the target-sensing resonant sensor operating at the target-sensing resonant frequency state corresponding to the target-sensing condition.

The IDC unit outputs sensor data corresponding to the target-sensing resonance control signal, such that the output sensor data is representative of the target-sensing condition for the respective target-sensing resonant sensor, differentiated from any target-sensing condition for another resonant sensor. Thus, the output sensor data (target-sensing resonance control signal) is therefore representative of the target position of the respective target relative to such target-sensing resonant sensor.

Thus, the methodology is adaptable to position sensing with multiple resonant sensors interfaced to an inductance-to-digital conversion (IDC) unit through an IDC single-channel interface, and includes: (a) driving, through the single-channel interface, the multiple resonant sensors to a system resonance state in which each resonant sensor is driven to a resonant frequency state; (b) generating, in response to a target-sensing condition of a target-sensing resonant sensor, a target-sensing resonance control signal; (c) driving, in response to the target-sensing resonance control signal, a target-sensing system resonance state corresponding to a target-sensing resonant sensor operating at a target-sensing resonant frequency state for the target-sensing condition; (d) thereby establishing an IDC control loop including as a loop filter each respective resonator of the series-loop coupled resonant sensors, the IDC control loop driving the system resonance state, including a nominal system resonance state in which each resonant sensor is driven to its nominal resonant frequency state, and including the target-sensing system resonance state in which at least one resonant sensor is driven to the target-sensing resonant frequency state associated with the target-sensing condition; and (e) outputting sensor data corresponding to the target-sensing resonance control signal, such that the output sensor data is representative of the target-sensing condition for the respective target-sensing resonant sensor, differentiated from any target-sensing condition for another resonant sensor, and is therefore representative of the target position of the respective target relative to such target-sensing resonant sensor.

Other aspects and features of the invention claimed in this Patent Document will be apparent to those skilled in the art from the following Disclosure.

BRIEF DESCRIPTION OF THE DRAWINGS

FIG. 3 illustrates an example embodiment of an IDC unit with a single-channel interface to multiple resonant sensors, configured to drive a system resonance state with each resonant sensor driven to a resonant frequency state, converting a change in system resonance state resulting from a target-sensing condition into corresponding sensor data, the IDC implementing a negative impedance control loop, incorporating the multiple resonant sensors as loop filters, and controlling negative impedance at the IDC single-channel interface to drive a target-sensing system resonance state, effectively driving a target-sensing resonant sensor to a target-sensing resonant frequency state corresponding to a position of its respective target within its sensing range, and including outputting sensor data corresponding to the controlled negative impedance as representing the target-sensing resonant frequency state as an indication of target position (proximity or range).

DESCRIPTION

This Description and the Figures constitute a Disclosure of example embodiments and applications that illustrate various features and advantages of the invention, aspects of which are defined by the Claims. Known circuits, functions and operations are not described in detail to avoid unnecessarily obscuring the principles and features of the invention.

In brief overview, an inductance-to-digital conversion (IDC) unit, including a single-channel interface, is operable in an inductive position sensing system with multiple resonant sensors, configured in a series-loop topology, interfaced to the IDC unit through the single-channel interface. Each resonant sensor is adapted to sense target position as a position of a respective conductive target within a sensing range relative to the resonant sensor, and each includes a resonator configured for a resonant frequency state (steady-state oscillation amplitude and resonator frequency), and a sensing range. Each resonant sensor is configured for operation at: (a) a nominal resonant frequency state in which the target for the resonant sensor is outside its sensing range, the resonator configured so that the nominal resonant frequency state is unique relative to a nominal resonant frequency state of any other resonant sensor; and (b) a target-sensing resonant frequency state that corresponds to a target-sensing resonant sensor in a target-sensing condition in which its respective target is at a target position within its sensing range, the resonator configured so that the target-sensing resonant frequency state does not overlap with any target-sensing resonant frequency state of any other resonant sensor in a respective target-sensing condition.

The IDC unit, with single-channel interface to the multiple resonant sensors in a series loop, includes: (a) resonance control circuitry configured to control system resonance state in response to a resonance control signal, including a target-sensing system resonance state in response to a target-sensing condition at a target-sensing resonant sensor; and (b) IDC loop control circuitry configured to generate the resonance control signal, including a target-sensing resonance control signal corresponding to the target-sensing system resonance state for the target-sensing condition. The resonance control circuitry and the IDC loop control circuitry establish an IDC control loop, including as a loop filter each respective resonator of the series-loop coupled resonant sensors, and operable to drive a system resonance state in which each resonant sensor is driven to a resonant frequency state, including a nominal system resonance state in which each resonant sensor is driven to its nominal resonant frequency state, and including a target-sensing system resonance state in which at least one resonant sensor is driven to a target-sensing resonant frequency state associated with a target-sensing condition. For target-sensing conditions, the resonance control circuitry is responsive to the target-sensing resonance control signal to drive system resonance state to the target-sensing system resonance state, with the target-sensing resonant sensor operating at the target-sensing resonant frequency state corresponding to the target-sensing condition. The IDC unit outputs sensor data corresponding to the target-sensing resonance control signal, such that the output sensor data is representative of the target-sensing condition for the respective target-sensing resonant sensor, differentiated from any target-sensing condition for another resonant sensor, and is therefore representative of the target position of the respective target relative to such target-sensing resonant sensor.

Figure 1A:
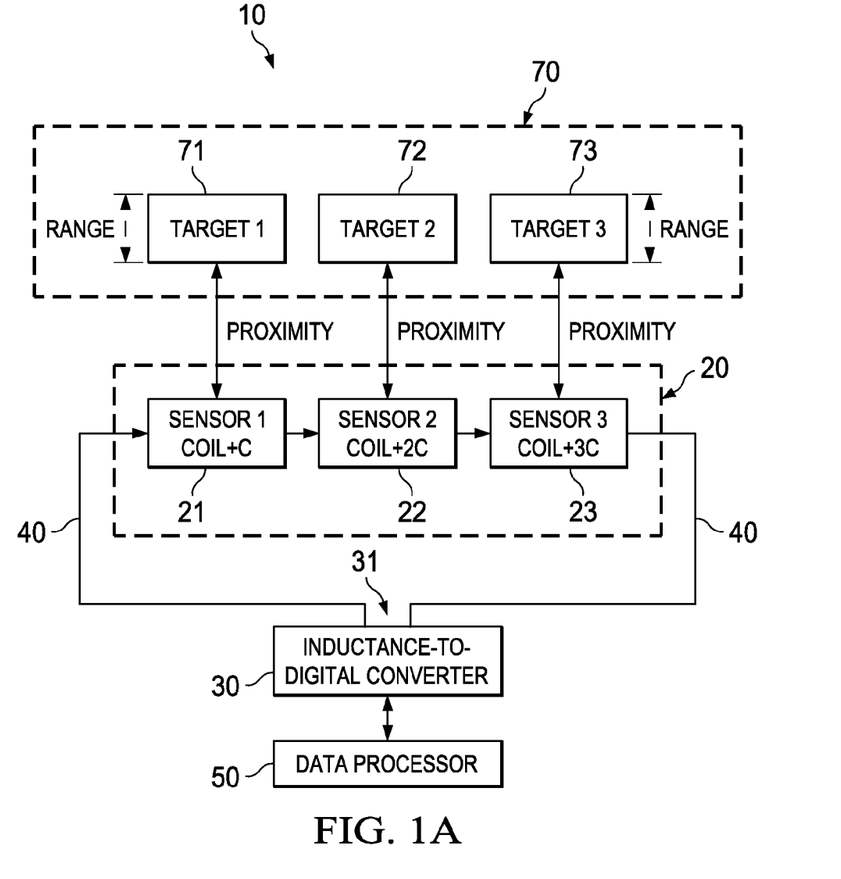
FIG. 1A is an example functional illustration of an inductive position sensing system with multiple resonant sensors adapted for sensing position (proximity or range) of respective conductive targets, the multiple resonant sensors arranged in a series-loop topology, interfaced through a single channel to an inductance-to-digital conversion (IDC) unit, and differentiated based on respective resonator configurations with different capacitance values (identical inductors): Sensor1 (Coil+C), Sensor2 (Coil+2C), Sensor3 (Coil+3C).

FIG. 1A is an example functional illustration of an inductive position sensing system 10 including multiple resonant sensors 20 and an inductance-to-digital conversion (IDC) unit 30. As an example implementation, three resonant sensors 21,22,23 are illustrated.

IDC 30 includes an IDC single-channel interface 31. IDC 30 and resonant sensors 20 are configured in a series-loop (daisy chain) topology. Specifically, IDC 30 is series-loop coupled to resonant sensors 20 through IDC single-channel interface 31, over a series loop 40. Resonant sensors 20 (21, 22,23) are adapted to sense a position (proximity or range) of respective conductive targets 70 (71,72,73).

IDC 30 establishes an IDC control loop that incorporates resonant sensors 20 as loop filters. The IDC control loop drives resonant sensors 20 to a system resonance state in which each resonant sensor is driven to a resonant frequency state. Each resonant sensor is configured for a nominal resonant frequency state that differentiates it within series-loop

40. IDC 30 senses changes in system resonance state representative of target-sensing conditions (a resonant sensor with its respective target at a position within its sensing range), and responds by driving the resonant sensors to a corresponding target-sensing system resonance state (including driving a target-sensing resonant sensor to its target-sensing resonant frequency state). IDC 30 converts IDC loop (resonance) control signals corresponding to changes in system resonance state resulting from a target-sensing condition into sensor data as representing the corresponding target-sensing resonant frequency state as an indication of target position (proximity or range) relative to a target-sensing resonant sensor. The sensor data can be provided to a data processor 50 for proximity/range processing.

Resonant sensors 20, driven as a system by IDC 30 through the IDC signal channel interface 31 (over series loop 40), are differentiated based on system resonance state. Resonant sensors 20 are configured for unique, non-overlapping nominal resonant frequency states (resonant oscillation frequency and resonant oscillation amplitude), so that system resonance state, and in particular target-sensing system resonance states, effectively differentiate a target-sensing resonant sensor and its target response (proximity or range), received by IDC 30 through IDC single-channel interface 31.

Figure 1B:
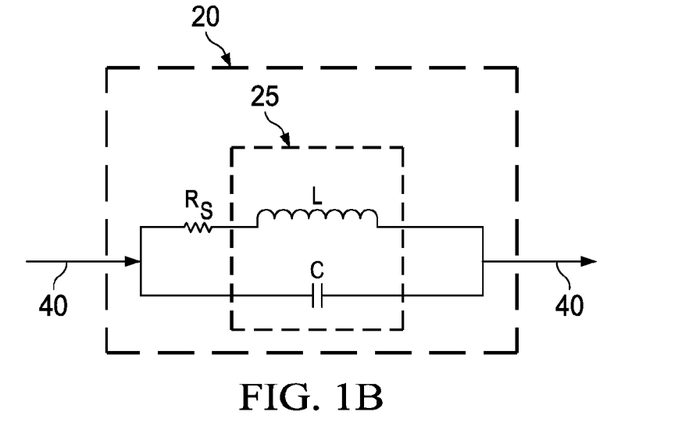
FIG. 1B illustrates an example embodiment of a resonant sensor, including an LC resonator, and associated resonant impedance $R_S$.

Referring also to FIG. 1B, each example resonant sensor 20 includes a resonator 25, configured with an inductor L and a parallel capacitor C (tank circuit). The LC resonator can be configured as a series rather than parallel resonator. A resistor $R_S$ represents resonant impedance (effective impedance at resonance), corresponding to circuit parasitic losses within the resonator, and, for target conditions, eddy current losses to the target.

Resonator 25 can be configured for resonant frequency state, and sensing range. Resonant frequency state is steady-state resonator oscillation amplitude and resonator frequency.

Resonator 25 can be configured for operation at a design-specified nominal resonant frequency state (no target present). That is, operating at the nominal resonant frequency state, resonant sensor 20 is driven with sufficient power over series loop 40 (from IDC 30 through the IDC single-channel interface 31) to maintain steady-state oscillation by counterbalancing nominal resonant impedance resulting from circuit parasitics, i.e., with no target present, and therefore no eddy current losses. Resonator 25 is configured so that the nominal resonant frequency state is unique relative to a nominal resonant frequency state of any other resonant sensor.

Resonator 25 is further configured so that a target-sensing resonant frequency state does not overlap with any target-sensing resonant frequency state of any other resonant sensor (resonator), where a target-sensing resonant frequency state corresponds to a target-sensing resonant sensor in a target-sensing condition. A target-sensing condition occurs when a target 70 is at a target position within a sensing range of resonant sensor 20. Sensing range depends upon resonator configuration, target configuration and the design-specified resolution for IDC 30.

In FIG. 1A, resonant sensors 20 are each configured for a nominal resonant frequency state that is unique (non-overlapping) relative to the nominal resonant frequency state of the other resonant sensors, differentiating resonant sensors 20 in the series loop 40 based on the unique respective nominal resonant frequency states. The example implementation is to configure resonant sensors 20 with LC resonators differentiated based on capacitance value C (with fixed inductance value L): resonant sensor 21 (L Coil+C), resonant sensor 22 (L Coil+2C), resonant sensor 23 (L Coil+3C). In other embodiments, inductance or inductance and capacitance can be used to differentiate resonator frequency.

Figure 2:
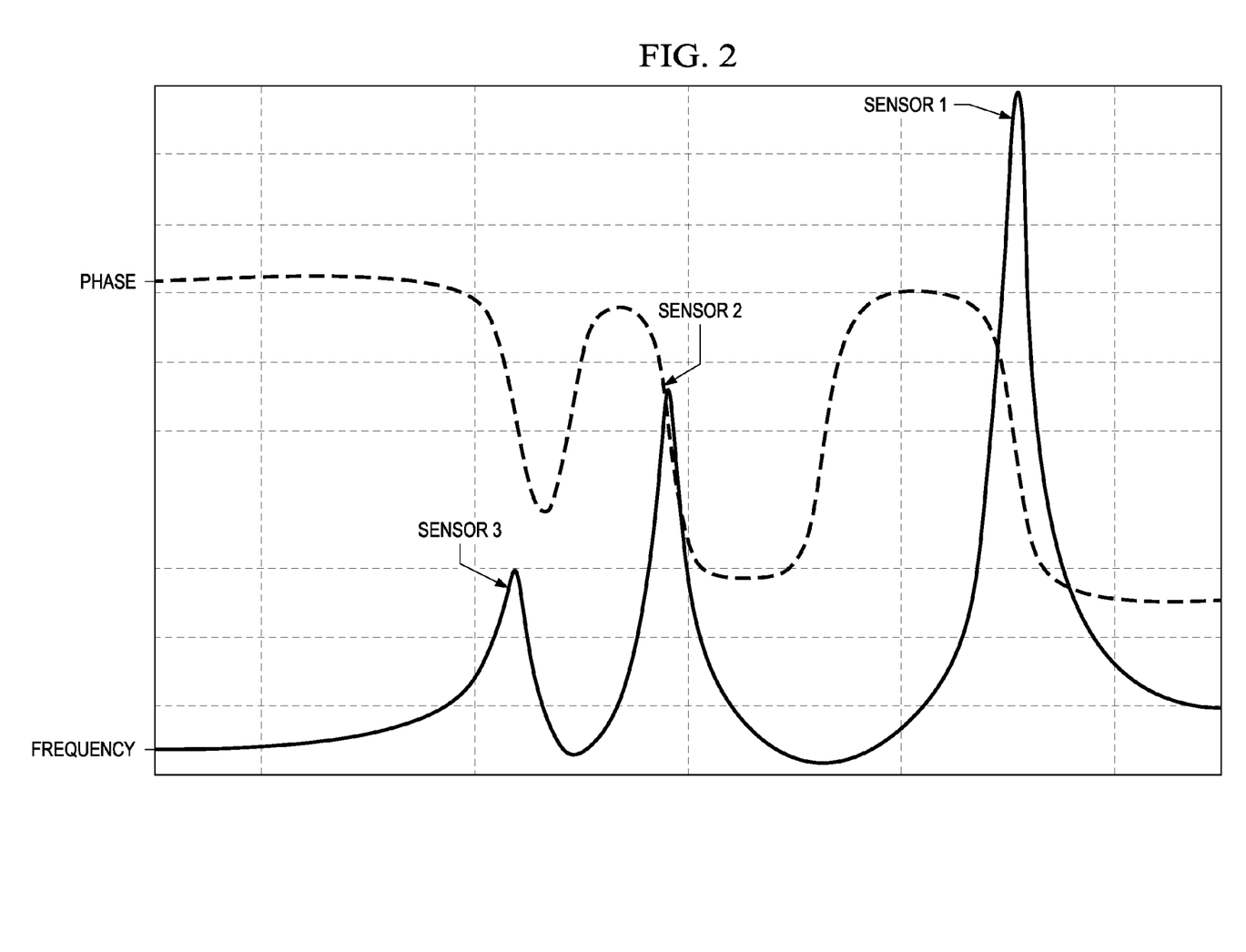
FIG. 2 illustrates, for the multiple sensor configuration illustrated in FIG. 1A, example nominal resonant frequency waveforms (phase and frequency) corresponding to a nominal system resonant frequency state in which the resonant sensors are differentiated by respective, non-overlapping nominal resonant frequency states (nominal resonant frequency and resonant amplitude), where nominal resonant frequency decreases with increasing resonator capacitance (respectively C, 2C, 3C), and where nominal resonant amplitude also decreases due to identical resonator inductors.

FIG. 2 provides example nominal resonant frequency waveforms (phase and frequency) for the multiple resonant sensor configuration illustrated in FIG. 1A. Specifically, resonant sensors 21,22,23 are configured such that resonant frequency decreases with increasing resonator capacitance (respectively capacitances C, 2C, 3C). Due to identical resonant inductors, resonant amplitude also decreases (further differentiating the resonant frequency states). The relationship between capacitance values is a design choice to achieve the resonant frequency separation appropriate for the application.

Referring also to FIG. 1A, position sensing system 10, including resonant sensors 20 and IDC 30, is characterized by a system resonance state, including a nominal system resonance state in which all resonant sensors are at respective nominal resonant frequency states (FIG. 2). IDC unit 30 is configured to drive a system resonance state in which each resonant sensor is driven to a resonant frequency state. With no resonant sensor in a target-sensing condition, IDC 30 drives a nominal system resonance state in which each resonant sensor 20 is driven to its nominal resonant frequency state. For a target sensing condition, IDC 30 drives a target-sensing system resonance state in which a target-sensing resonant sensor is driven to a target-sensing resonant frequency state associated with the target-sensing condition.

IDC 30 establishes an IDC control loop that includes as a loop filter each respective resonator 25 of the series-loop coupled resonant sensors 20. IDC control loop provides resonance control based on resonance (loop) control signals. The IDC control loop controls system resonance state in response to the resonance control signals, including driving a target-sensing system resonance state in response to a target-sensing condition at a target-sensing resonant sensor. The IDC loop generates the resonance control signals, including a target-sensing resonance control signal corresponding to the target-sensing system resonance state for the target-sensing condition. IDC 30 is responsive to the target-sensing resonance control signal to drive system resonance state to the target-sensing system resonance state, with the target-sensing resonant sensor operating at the target-sensing resonant frequency state corresponding to the target-sensing condition.

IDC 30 outputs sensor data corresponding to the target-sensing resonance control signal, as representative of a target-sending condition. In effect, IDC 30 converts a target-sensing system resonant state (as represented by the target-sensing resonance control signal) into sensor data representative of the target-sensing condition for the respective target-sensing resonant sensor. Such target sensing condition is differentiated from any target-sensing condition for another resonant sensor, and is therefore representative of the target position of the respective target relative to such target-sensing resonant sensor.

Sensor differentiation based on resonant frequency state is an important design consideration for implementations of position sensing system 10, as sensor differentiation enables the multiple resonant sensors to interface to a single IDC 30 through the IDC single-channel interface 31. Additional system design criteria for implementations of position sensing system 10 include: (a) system configuration for proximity or range detection; and (b) IDC resolution.

Position sensing system 10 can be designed for either proximity or range sensing. For proximity sensing/detection, position sensing system 10 is designed to sense target 70 proximity relative to the target-sensing resonant sensor 20, where target proximity is a design-specified proximity distance. For range detection, position sensing system 10 is designed to sense target position relative to the target-sensing resonant sensor 20, where target position is position within a design-specified sensing range (and at a design-specified position resolution).

Target proximity sensing is based on a target-proximity-sensing resonant frequency state that corresponds to the respective target 70 at the design-specified proximity distance. This target-proximity resonant frequency state is unique for the target-sensing resonant sensor 20 (based on resonator design), enabling IDC 30 to capture/convert the target-proximity resonant frequency state, differentiated as to a target-sensing resonant sensor 20, and output target-proximity/detection sensor data representative of the respective target 70 at the design-specified proximity distance relative to the target-sensing resonant sensor. That is, for the target-sensing resonant sensor 20, the target-proximity resonant frequency state corresponding to the respective target 70 at the design-specified proximity distance for such target-sensing resonant sensor, does is differentiable from any target-proximity resonant frequency state of the other resonant sensors 20.

Target range sensing is based on a target-range-sensing resonant frequency state that corresponds to the position of the respective target 70 within the design-specified sensing range (with the design-specified position resolution). Each target-position/range resonant frequency state is unique for the target-sensing resonant sensor 20 (based on resonator design), enabling IDC 30 to capture/convert the target-position/range resonant frequency state, differentiated as to a target-sensing resonant sensor 20, and output target-range sensor data representative of the position of the respective target 70 within the design-specified sensing range relative to the target-sensing resonant sensor. That is, for the target-sensing resonant sensor 20, the range of target-position/range resonant frequency states corresponding to a position of the respective target 70 within the design-specified sensing range for the target-sensing resonant sensor, does not overlap with any target-position/range resonant frequency state of the other resonant sensors 20 (with respective sensing ranges).

Figure 3:
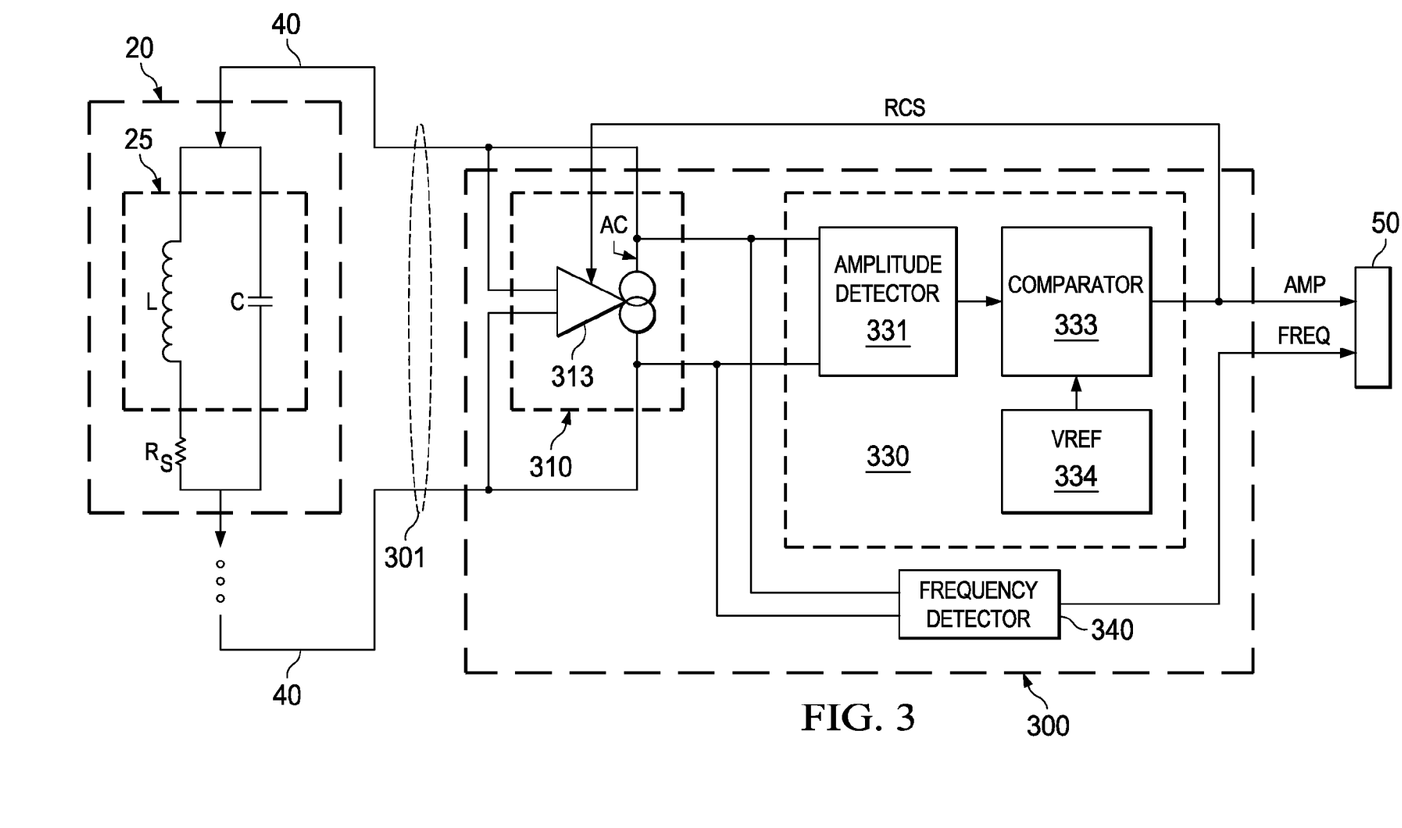

FIG. 3 illustrates an example embodiment of an IDC unit 300 that implements an IDC negative impedance control loop, including as a loop filter each resonator of the respective series-loop coupled resonant sensors 20. The IDC negative impedance control loop includes negative impedance circuitry 301 and the negative impedance control circuitry 330.

For target sensing conditions, the IDC negative impedance control loop is operable to control the negative impedance driven to IDC single-channel interface 301 to counterbalance any change in resonant impedance of a target-sensing resonant sensor 20, thereby driving the target-sensing resonant sensor to the target-sensing resonant frequency state corresponding to the target-sensing condition. Negative impedance circuitry 301 drives system resonance state by driving a negative impedance to the IDC single-channel interface in response to a negative impedance control signal.

Negative impedance control circuitry 330 generates a target-sensing negative impedance control signal based on a change in system oscillation amplitude resulting from a change in the resonant impedance of the target-sensing resonant sensor caused by the target-sensing condition. That is, the target-sensing negative impedance control signal corresponds to the target-sensing system resonance state for the target-sensing condition. Negative impedance circuitry 330 is responsive to the target-sensing negative impedance control signal to drive a negative impedance to IDC single-channel interface 301 corresponding to the target-sensing system resonance state.

IDC 300 outputs sensor data corresponding to the negative impedance control signal RCS. The output sensor data is representative of the negative impedance required to counterbalance resonant impedance of the target-sensing resonant sensor, resulting from the target-sensing condition. That is, the negative impedance control signal is representative of the target position of the respective target relative to such target-sensing resonant sensor.

The IDC control loop drives system resonance state by driving a negative impedance to IDC single-channel interface 301 in response to a resonance (negative impedance) control signal RCS. For a target-sensing condition, the IDC control loop generates a corresponding target-sensing negative impedance control signal based on a change in system oscillation amplitude resulting from a change in the resonant impedance of the target-sensing resonant sensor caused by the target-sensing condition. That is, the target-sensing negative impedance control signal corresponds to the target-sensing system resonance state for the target-sensing condition.

In response to the target-sensing negative impedance control signal, IDC 300 drives a negative impedance to IDC single-channel interface 301 corresponding to the target-sensing system resonance state. IDC 300 controls the negative impedance driven to IDC single-channel interface 301 to counterbalance the change in resonant impedance of a target-sensing resonant sensor resulting from the target condition. As a result, the target-sensing resonant sensor is driven to the corresponding target-sensing resonant frequency state corresponding to the target-sensing condition.

IDC 300 outputs sensor data corresponding to the target-sensing negative impedance control signal. The target-sensing negative impedance control signal corresponds to the negative impedance required to counterbalance resonant impedance of the target-sensing resonant sensor resulting from the target-sensing condition, and is therefore representative of the target position of the respective target relative to a target-sensing resonant sensor.

For the example implementation, negative impedance circuit 310 is implemented as a transconductance amplifier 313, configured as a controlled negative impedance. Impedance control circuitry 330 is implemented as an amplitude control circuit that detects changes in resonator oscillation amplitude as representing changes in resonance state, and provides the feedback RCS resonance control signal. The RCS resonance control signal is input to transconductance amplifier 313 to control negative impedance, and thereby control the amount of excitation power supplied to resonator 25 to counterbalance changes in resonant impedance, and maintain a resonant frequency state (steady-state oscillation).

Impedance control circuit 330 includes an amplitude detector 331 and a comparator output circuit 333. Amplitude detector 331 determines resonator oscillation amplitude. Comparator output circuit 333 compares resonator oscillation amplitude from amplitude detector 331 to a reference amplitude 334, and generates the resonance control signal RCS.

The example implementation of IDC 300 includes a frequency detector circuit 340 that measures the oscillation frequency associated with a system resonance state. For example, the frequency detection circuit can be implemented with a clocked frequency counter (counting clock cycles between zero crossings). Oscillation frequency can be used to determine inductance for resonator 25 (inductance coil L), which also changes based on changes in resonance state.

IDC 300 provides separate sensor data outputs for oscillation amplitude and oscillation frequency: oscillation amplitude is provided as the RCS negative impedance control signal from impedance control circuit 330, and resonator oscillation frequency is provided by frequency detector circuit 340. These sensor data outputs are provided to sensor data processor 50, for use in position processing (proximity or range).

The Disclosure provided by this Description and the Figures sets forth example embodiments and applications, including associated operations and methods, that illustrate various aspects and features of the invention. These example embodiments and applications may be used by those skilled in the art as a basis for design modifications, substitutions and alternatives to construct other embodiments, including adaptations for other applications, Accordingly, this Description does not limit the scope of the invention, which is defined by the Claims.

The invention claimed is:

1. An inductive position sensing system with multiple resonant sensors, each to sense target position as a position of a respective conductive target within a sensing range relative to the resonant sensor, comprising:
  multiple resonant sensors and an inductance-to-digital conversion (IDC) unit with an IDC single-channel interface, configured in a series-loop topology with the resonant sensors coupled in a series loop to the IDC single-channel interface of the IDC unit;
  each resonant sensor including a resonator with a resonant frequency state, and a sensing range, and with:
    a nominal resonant frequency state in which the target for the resonant sensor is outside its sensing range, the nominal resonant frequency state unique relative to a nominal resonant frequency state of any other resonant sensor; and
    a target-sensing resonant frequency state that corresponds to a target-sensing resonant sensor in a target-sensing condition in which its respective target is at a target position within its sensing range, and that does not overlap with any target-sensing resonant frequency state of any other resonant sensor in a respective target-sensing condition;
  the IDC unit to drive a system resonance state in which each resonant sensor is driven to a resonant frequency state, including a nominal system resonance state in which each resonant sensor is driven to its nominal resonant frequency state, and including a target-sensing system resonance state in which at least one resonant sensor is driven to a target-sensing resonant frequency state associated with a target-sensing condition, the IDC unit including:
    an IDC control loop including resonance control circuitry and IDC loop control circuitry, and including as a loop filter each respective resonator of the series-loop coupled resonant sensors;
    the resonance control circuitry to control system resonance state in response to a resonance control signal, including a target-sensing system resonance state in response to a target-sensing condition at a target-sensing resonant sensor;
    the IDC loop control circuitry to generate the resonance control signal, including a target-sensing resonance control signal corresponding to the target-sensing system resonance state for the target-sensing condition;
    the resonance control circuitry responsive to the target-sensing resonance control signal to drive system resonance state to the target-sensing system resonance state, with the target-sensing resonant sensor operating at the target-sensing resonant frequency state corresponding to the target-sensing condition; and
    sensor data output circuitry to output sensor data corresponding to the target-sensing resonance control signal, such that the output sensor data is representative of the target-sensing condition for the respective target-sensing resonant sensor, differentiated from any target-sensing condition for another resonant sensor, and is therefore representative of the target position of the respective target relative to such target-sensing resonant sensor.

2. The system of claim 1, wherein
  each resonant sensor having a resonant impedance; and
  the resonance control circuitry is responsive to the target-sensing resonance control signal to drive the target-sensing system resonant frequency state corresponding to the target-sensing condition, counterbalancing a change in resonant impedance of the target-sensing resonant sensor resulting from the target-sensing condition.

3. The system of claim 2, wherein:
  the resonance control circuitry comprises negative impedance circuitry configured to drive system resonance state by driving a negative impedance to the IDC single-channel interface in response to a negative impedance control signal; and
  the IDC loop control circuitry comprises negative impedance control circuitry to generate the negative impedance control signal, including a target-sensing negative impedance control signal, corresponding to the target-sensing system resonance state for the target-sensing condition, based on a change in a system oscillation amplitude resulting from a change in the resonant impedance of the target-sensing resonant sensor resulting from the target-sensing condition;
  the negative impedance circuitry responsive to the target-sensing negative impedance control signal to drive a negative impedance to the IDC single-channel interface corresponding to the target-sensing system resonance state; and
  the negative impedance circuitry and the negative impedance control circuitry operable as a negative impedance control loop, including as a loop filter each resonator of the respective series-loop coupled resonant sensors, and configured to control the negative impedance driven to the IDC single-channel interface to counterbalance any change in resonant impedance of a target-sensing resonant sensor, thereby driving the target-sensing resonant sensor to the target-sensing resonant frequency state corresponding to the target-sensing condition;
  wherein the output sensor data corresponds to the negative impedance control signal, such that the output sensor data is representative of the negative impedance required to counterbalance resonant impedance of the target-sensing resonant sensor, resulting from the target-sensing condition, and is therefore representative of the target position of the respective target relative to such target-sensing resonant sensor.

4. The system of claim 1, wherein the output sensor data is representative of a target-proximity condition corresponding to a respective target at a specified proximity distance relative to the target-sensing resonant sensor, the sensor data representative of the target-sensing resonant frequency state corresponding to the target-proximity condition, which uniquely differentiates the target-sensing resonant sensor.

5. The system of claim 1, wherein the output sensor data is representative of a target-range condition corresponding to a respective target at a position within the sensing range for the target-sensing resonant sensor, the sensor data representative of the target-sensing resonant frequency state corresponding to the target-range condition, which uniquely differentiates the target-sensing resonant sensor.

6. The system of claim 1, wherein each resonant sensor resonator includes an inductor and a capacitor:
the inductor having an inductance value that is substantially identical for each resonator;
the capacitor having a capacitance value that is unique relative to the other resonators, and is specified such that:
the associated nominal resonant frequency state is differentiated from the associated nominal resonant frequency state for any other resonant sensor; and
any associated target-sensing resonant frequency state for such resonant sensor and its sensing range does not overlap with any target-sensing resonant frequency state for any other resonant sensor.

7. The system of claim 1, wherein the IDC unit further comprises:
resonator frequency circuitry to generate a system frequency signal corresponding to a system frequency corresponding to the system resonance state, including a target-sensing system frequency signal corresponding to a target-sensing system frequency for the target-sensing system resonant state, such that the sensor data representative of the target-sensing condition is based on at least one of the corresponding target-sensing resonator control signal and the target-sensing system frequency signal.

8. An inductance-to-digital conversion (IDC) circuit suitable for use in an inductive position sensing system with multiple resonant sensors, configured in a series-loop topology, each resonant sensor suitable to sense target position as a position of a respective conductive target within a sensing range relative to the resonant sensor, each resonant sensor including a resonator with a resonant frequency state, and a sensing range, and with a nominal resonant frequency state in which the target for the resonant sensor is outside its sensing range, the nominal resonant frequency state begin unique relative to a nominal resonant frequency state of any other resonant sensor, and a target-sensing resonant frequency state that corresponds to a target-sensing resonant sensor in a target-sensing condition in which its respective target is at a target position within its sensing range, and that does not overlap with any target-sensing resonant frequency state of any other resonant sensor in a respective target-sensing condition, the IDC circuit comprising:
a single-channel interface coupled to the multiple resonant sensors in a series loop;
resonance control circuitry to control system resonance state in response to a resonance control signal, including a target-sensing system resonance state in response to a target-sensing condition at a target-sensing resonant sensor;
IDC loop control circuitry to generate the resonance control signal, including a target-sensing resonance control signal corresponding to the target-sensing system resonance state for the target-sensing condition;
the resonance control circuitry and the IDC loop control circuitry operable as an IDC control loop including as a loop filter each respective resonator of the series-loop coupled resonant sensors, the IDC control loop to drive a system resonance state in which each resonant sensor is driven to a resonant frequency state, including a nominal system resonance state in which each resonant sensor is driven to its nominal resonant frequency state, and including a target-sensing system resonance state in which at least one resonant sensor is driven to a target-sensing resonant frequency state associated with a target-sensing condition;
the resonance control circuitry responsive to the target-sensing resonance control signal to drive system resonance state to the target-sensing system resonance state, with the target-sensing resonant sensor operating at the target-sensing resonant frequency state corresponding to the target-sensing condition; and
sensor data output circuitry to output sensor data corresponding to the target-sensing resonance control signal, such that the output sensor data is representative of the target-sensing condition for the respective target-sensing resonant sensor, differentiated from any target-sensing condition for another resonant sensor, and is therefore representative of the target position of the respective target relative to such target-sensing resonant sensor.

9. The circuit of claim 8, wherein
each resonant sensor is having a resonant impedance; and
the resonance control circuitry is responsive to the target-sensing resonance control signal to drive the target-sensing system resonant frequency state corresponding to the target-sensing condition, counterbalancing a change in resonant impedance of the target-sensing resonant sensor resulting from the target-sensing condition.

10. The circuit of claim 9,
wherein driving the system resonance state, including the target-sensing system resonance state is accomplished by driving a negative impedance to the IDC single-channel interface in response to a negative impedance control signal; and
wherein generating, in response to a target-sensing condition of a target-sensing resonant sensor, a target-sensing resonance control signal is accomplished by generating a target-sensing negative impedance control signal corresponding to the target-sensing system resonance state based on a change in a system oscillation amplitude resulting from a change in a resonant impedance of the target-sensing resonant sensor resulting from the target-sensing condition;
wherein the IDC control loop comprises an IDC negative impedance control loop that is configured to control the negative impedance driven to the IDC single-channel interface to counterbalance any change in a resonant impedance of a target-sensing resonant sensor, thereby driving the target-sensing resonant sensor to the target-sensing resonant frequency state corresponding to the target-sensing condition; and
wherein the output sensor data corresponds to the negative impedance control signal, such that the output sensor data is representative of the negative impedance required to counterbalance resonant impedance of the target-sensing resonant sensor, resulting from the target-sensing condition, and is therefore representative of the target position of the respective target relative to such target-sensing resonant sensor.

11. The circuit of claim 8, wherein the output sensor data is representative of a target-proximity condition corresponding to a respective target at a specified proximity distance relative to the target-sensing resonant sensor, the sensor data representative of the target-sensing resonant frequency state corresponding to the target-proximity condition, which uniquely differentiates the target-sensing resonant sensor.

12. The circuit of claim 8, wherein the output sensor data that is representative of a target-range condition corresponding to a respective target at a position within the sensing range for the target-sensing resonant sensor, the sensor data representative of the target-sensing resonant frequency state corresponding to the target-range condition, which uniquely differentiates the target-sensing resonant sensor.

13. The circuit of claim 8, wherein each resonant sensor resonator includes an inductor and a capacitor:
the inductor having an inductance value that is substantially identical for each resonator;
the capacitor having a capacitance value that is unique relative to the other resonators, and is specified such that:
the associated nominal resonant frequency state is differentiated from the associated nominal resonant frequency state for any other resonant sensor; and
any associated target-sensing resonant frequency state for such resonant sensor and its sensing range does not overlap with any target-sensing resonant frequency state for any other resonant sensor.

14. The circuit of claim 8, wherein the IDC unit further comprises:
resonator frequency circuitry to generate a system frequency signal corresponding to a system frequency corresponding to the system resonance state, including target sensing system frequency signal corresponding to a target-sensing system frequency for the target-sensing system resonant state, such that the sensor data representative of the target-sensing condition is based on at least one of the corresponding target-sensing resonator control signal and the target-sensing system frequency signal.

15. The circuit of claim 9, wherein:
the resonance control circuitry comprises negative impedance circuitry to drive system resonance state by driving a negative impedance to the IDC single-channel interface in response to a negative impedance control signal; and
the IDC loop control circuitry comprises negative impedance control circuitry to generate the negative impedance control signal, including a target-sensing negative impedance control signal, corresponding to the target-sensing system resonance state for the target-sensing condition, based on a change in a system oscillation amplitude resulting from a change in the resonant impedance of the target-sensing resonant sensor resulting from the target-sensing condition;
the negative impedance circuitry responsive to the target-sensing negative impedance control signal to drive a negative impedance to the IDC single-channel interface corresponding to the target-sensing system resonance state; and
the negative impedance circuitry and the negative impedance control circuitry operable as a negative impedance control loop, including as a loop filter each resonator of the respective series-loop coupled resonant sensors, and configured to control the negative impedance driven to the IDC single-channel interface to counterbalance any change in resonant impedance of a target-sensing resonant sensor, thereby driving the target-sensing resonant sensor to the target-sensing resonant frequency state corresponding to the target-sensing condition;
wherein the output sensor data corresponds to the negative impedance control signal, such that the output sensor data is representative of the negative impedance required to counterbalance resonant impedance of the target-sensing resonant sensor, resulting from the target-sensing condition, and is therefore representative of the target position of the respective target relative to such target-sensing resonant sensor.

16. A method useable in an inductive position sensing system with multiple resonant sensors and an inductance-to-digital converter (IDC) unit configured in a series-loop topology, with the resonant sensors series-loop coupled to a single-channel interface to the IDC, each resonant sensor to sense target position as a position of a respective conductive target within a sensing range relative to the resonant sensor, each resonant sensor including a resonator with a resonant frequency state, and a sensing range, and with a nominal resonant frequency state in which the target for the resonant sensor is outside its sensing range the nominal resonant frequency state being unique relative to a nominal resonant frequency state of any other resonant sensor, and a target-sensing resonant frequency state that corresponds to a target-sensing resonant sensor in a target-sensing condition in which its respective target is at a target position within its sensing range, and that does not overlap with any target-sensing resonant frequency state of any other resonant sensor in a respective target-sensing condition, the method comprising:
driving, through the single-channel interface, the multiple resonant sensors to a system resonance state in which each resonant sensor is driven to a resonant frequency state;
generating, in response to a target-sensing condition of a target-sensing resonant sensor, a target-sensing resonance control signal;
driving, in response to the target-sensing resonance control signal, a target-sensing system resonance state corresponding to a target-sensing resonant sensor operating at a target-sensing resonant frequency state for the target-sensing condition;
thereby establishing an IDC control loop including as a loop filter each respective resonator of the series-loop coupled resonant sensors, the IDC control loop driving the system resonance state, including a nominal system resonance state in which each resonant sensor is driven to its nominal resonant frequency state, and including the target-sensing system resonance state in which at least one resonant sensor is driven to the target-sensing resonant frequency state associated with the target-sensing condition; and
outputting sensor data corresponding to the target-sensing resonance control signal, such that the output sensor data is representative of the target-sensing condition for the respective target-sensing resonant sensor, differentiated from any target-sensing condition for another resonant sensor, and is therefore representative of the target position of the respective target relative to such target-sensing resonant sensor.

17. The method of claim 16, wherein the output sensor data is representative of a target-proximity condition corresponding to a respective target at a specified proximity distance relative to the target-sensing resonant sensor, the sensor data representative of the target-sensing resonant frequency state corresponding to the target-proximity condition, which uniquely differentiates the target-sensing resonant sensor.

18. The method of claim 16, wherein the output sensor data that is representative of a target-range condition corresponding to a respective target at a position within the sensing range for the target-sensing resonant sensor, the sensor data representative of the target-sensing resonant frequency state corresponding to the target-range condition, which uniquely differentiates the target-sensing resonant sensor.

19. The method of claim 16, wherein each resonant sensor resonator includes an inductor and a capacitor:
- the inductor having an inductance value that is substantially identical for each resonator;
- the capacitor having a capacitance value that is unique relative to the other resonators, and is specified such that:
    - the associated nominal resonant frequency state is differentiated from the associated nominal resonant frequency state for any other resonant sensor; and
    - any associated target-sensing resonant frequency state for such resonant sensor and its sensing range does not overlap with any target-sensing resonant frequency state for any other resonant sensor.

20. The method of claim 16, further comprising:
generating a system frequency signal corresponding to a system frequency corresponding to the system resonance state, including a target sensing system frequency signal corresponding to a target-sensing system frequency for the target-sensing system resonant state, such that the sensor data representative of the target-sensing condition is based on at least one of the corresponding target-sensing resonator control signal and the target-sensing system frequency signal.

\* \* \* \* \*